(12) United States Patent
Yokoyama

(10) Patent No.: US 11,810,707 B2
(45) Date of Patent: *Nov. 7, 2023

(54) COIL COMPONENT

(71) Applicant: TAIYO YUDEN CO., LTD., Tokyo (JP)

(72) Inventor: Ichiro Yokoyama, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/670,825

(22) Filed: Feb. 14, 2022

(65) Prior Publication Data

US 2022/0165480 A1 May 26, 2022

Related U.S. Application Data

(63) Continuation of application No. 17/124,239, filed on Dec. 16, 2020, now Pat. No. 11,315,721, which is a
(Continued)

(30) Foreign Application Priority Data

May 31, 2019 (JP) ................................ 2019-102295

(51) Int. Cl.
   *H01F 27/28* (2006.01)
   *H01F 27/24* (2006.01)
   (Continued)

(52) U.S. Cl.
   CPC ......... *H01F 27/2804* (2013.01); *H01F 27/24* (2013.01); *H01F 27/292* (2013.01);
   (Continued)

(58) Field of Classification Search
   CPC ...... H01F 41/046; H01F 41/12; H01F 41/041; H01F 17/0013; H01F 27/324; H01F 27/292; H01F 27/24; H01F 27/2804; H05K 1/181
   See application file for complete search history.

(56) References Cited

U.S. PATENT DOCUMENTS

| 6,191,933 | B1  | 2/2001  | Ishigaki |
| 6,675,462 | B1* | 1/2004  | Takahashi ............. H01F 27/292 336/200 |
| 10,468,188 | B2  | 11/2019 | Tomizawa |
| 2001/0017420 | A1* | 8/2001 | Iwao ................... H01F 17/0013 257/693 |

(Continued)

FOREIGN PATENT DOCUMENTS

| JP | 2013-135220 A | 7/2013 |
| JP | 2016-152392 A | 8/2016 |

(Continued)

OTHER PUBLICATIONS

Notice of Reasons for Refusal dated Apr. 4, 2023, issued in corresponding Japanese Patent Application No. 2019-102295, with English translation (9 pgs.).

*Primary Examiner* — Hoag Nguyen
*Assistant Examiner* — Amol H Patel
(74) *Attorney, Agent, or Firm* — Pillsbury Winthrop Shaw Pittman, LLP

(57) ABSTRACT

A coil component according to one embodiment of the present invention includes a magnetic base body, a first external electrode, a second external electrode, a coil conductor extending around a coil axis, and an insulator. The insulator is provided between the flange portion of the second external electrode and the second coil pattern.

11 Claims, 5 Drawing Sheets

Related U.S. Application Data continuation of application No. 16/887,321, filed on May 29, 2020, now Pat. No. 10,902,992.

(51) Int. Cl.

| | | |
|---|---|---|
| *H01F 27/29* | (2006.01) | |
| *H01F 27/32* | (2006.01) | |
| *H01F 41/04* | (2006.01) | |
| *H01F 41/12* | (2006.01) | |
| *H05K 1/18* | (2006.01) | |
| *H01F 17/00* | (2006.01) | |
| *H01F 17/04* | (2006.01) | |

(52) U.S. Cl.
CPC ......... *H01F 27/324* (2013.01); *H01F 41/041* (2013.01); *H01F 41/12* (2013.01); *H05K 1/181* (2013.01); *H01F 2027/2809* (2013.01); *H05K 2201/1003* (2013.01)

(56) References Cited

U.S. PATENT DOCUMENTS

| | | |
|---|---|---|
| 2012/0188049 A1 | 7/2012 | Matsuura |
| 2013/0033347 A1 | 2/2013 | Matsuura |
| 2013/0038416 A1 | 2/2013 | Arai |
| 2013/0162382 A1 | 6/2013 | Cha et al. |
| 2014/0118100 A1* | 5/2014 | Sato .................... H01F 17/0013 336/200 |
| 2014/0132385 A1 | 5/2014 | Maruyama |
| 2016/0189850 A1 | 6/2016 | Lee |
| 2017/0069417 A1 | 3/2017 | Takeda |
| 2020/0033428 A1 | 1/2020 | Yoshinaka |
| 2020/0135380 A1* | 4/2020 | Tonoyama ................ H01F 1/33 |

FOREIGN PATENT DOCUMENTS

| | | |
|---|---|---|
| JP | 2017-050492 A | 3/2017 |
| JP | 2017-092505 | 5/2017 |

\* cited by examiner ically feature clean, minimalist designs with soft color palettes.

COIL COMPONENT

CROSS-REFERENCE TO RELATED APPLICATIONS

This application is a continuation of U.S. patent application Ser. No. 17/124,239 (filed on Dec. 16, 2020), which is a continuation of U.S. patent application Ser. No. 16/887,321 (filed on May 29, 2020), which claims the benefit of priority from Japanese Patent Application Serial No. 2019-102295 (filed on May 31, 2019), the contents of which are hereby incorporated by reference in their entirety.

TECHNICAL FIELD

The present invention relates to a coil component.

BACKGROUND

There are conventional coil components including a magnetic base body formed of a magnetic material, an external electrode provided on the surface of the magnetic base body, and a coil conductor provided in the magnetic base body. The conventional coil components are disclosed in, for example, Japanese Patent Application Publication No. 2017-092505.

One example of coil components is an inductor. An inductor is a passive element used in an electronic circuit. For example, an inductor eliminates noise in a power source line or a signal line. In general, a coil component is required to have a high inductance. In addition, a coil component to be installed in a small electronic device is required to be downsized.

With a smaller margin between the coil conductor and the external electrode, the coil conductor can have a larger core area and a larger number of turns, and therefore, the inductance of the coil component can be increased without increasing the size of the device. However, a small margin between the coil conductor and the external electrode may cause a leak current due to a reduced insulation therebetween. When a leak current occurs between the coil conductor and the external electrode, the coil component cannot provide desired properties.

SUMMARY

One object of the present invention is to provide a coil component that can produce an excellent inductance, while the size of the coil component is not increased and no dielectric breakdown occurs between the coil conductor and the external electrode. Other objects of the present invention will be made apparent through the entire description in the specification.

A coil component according to one embodiment of the present invention includes a magnetic base body, a first external electrode, a second external electrode, a coil conductor, and an insulator. The magnetic base body contains soft magnetic metal particles and has a first surface, a second surface opposed to the first surface, a third surface connecting between the first surface and the second surface, and a fourth surface opposed to the third surface. The first external electrode includes a first main electrode portion and a first flange portion, the first main electrode portion is provided on the first surface of the magnetic base body, and the first flange portion is provided on the third surface of the magnetic base body. The second external electrode includes a second main electrode portion and a second flange portion, the second main electrode portion is provided on the second surface of the magnetic base body, and the second flange portion is provided on the fourth surface of the magnetic base body. The coil conductor includes a first coil pattern and a second coil pattern, the first coil pattern is opposed to the third surface and includes a first lead-out conductor connected to the second external electrode, and the second coil pattern is opposed to the fourth surface and includes a second lead-out conductor connected to the first external electrode. The coil conductor extends around a coil axis intersecting the third surface and the fourth surface. The insulator is provided between the second flange portion of the second external electrode and the second coil pattern to cover a part of the fourth surface. A distance between the first coil pattern and the first flange portion of the first external electrode may be smaller than a distance between the first coil pattern and the first main electrode portion of the first external electrode. A distance between the second coil pattern and the second flange portion of the second external electrode may be smaller than a distance between the second coil pattern and the second main electrode portion of the second external electrode.

In one embodiment of the present invention, the insulator is positioned on a line segment connecting between any portion of the second flange portion of the second external electrode and any portion of the second coil pattern.

In one embodiment of the present invention, the insulator is positioned so as not to overlap the core region as viewed from a direction along the coil axis.

In one embodiment of the present invention, the magnetic base body includes a cover region disposed between the second conductor pattern and the fourth surface, and a density of the soft magnetic metal particles contained in the cover region is higher in a region overlapping the insulator as viewed from the direction along the coil axis than in a remaining region.

In one embodiment of the present invention, the insulator is optically distinguishable from the cover region.

In one embodiment of the present invention, the insulator includes a marker portion positioned so as not to overlap with the second flange portion of the second electrode as viewed from a direction along the coil axis.

The coil component according to one embodiment of the present invention includes another insulator provided between the first flange portion of the first external electrode and the first coil pattern to cover a part of the third surface. In one embodiment of the present invention, the other insulator is positioned on a line segment connecting between any portion of the first flange portion of the first external electrode and any portion of the first coil pattern.

In one embodiment of the present invention, the magnetic base body includes a core region disposed inside the coil conductor, and the other insulator is positioned so as not to overlap with the core region as viewed from the direction along the coil axis.

In one embodiment of the present invention, the magnetic base body includes another cover region disposed between the first conductor pattern and the third surface, and a density of the soft magnetic metal particles contained in the other cover region is higher in a region overlapping the other insulator as viewed from the direction along the coil axis than in a remaining region.

In one embodiment of the present invention, the other insulator is optically distinguishable from the other cover region.

In one embodiment of the present invention, the other insulator includes a marker portion positioned so as not to overlap with the first flange portion of the first electrode as viewed from a direction along the coil axis.

A circuit board according to one embodiment of the present invention includes the above coil component.

An electronic device according to one embodiment of the present invention includes the above circuit board.

ADVANTAGEOUS EFFECTS

The present invention provides a coil component that can produce an excellent inductance, while the size of the coil component is not increased and no dielectric breakdown occurs between the coil conductor and the external electrode.

DESCRIPTION OF THE EMBODIMENTS

Various embodiments of the invention will be described hereinafter with reference to the drawings. Elements common to a plurality of drawings are denoted by the same reference signs throughout the plurality of drawings. It should be noted that the drawings do not necessarily appear to an accurate scale for convenience of explanation.

Figure 1:
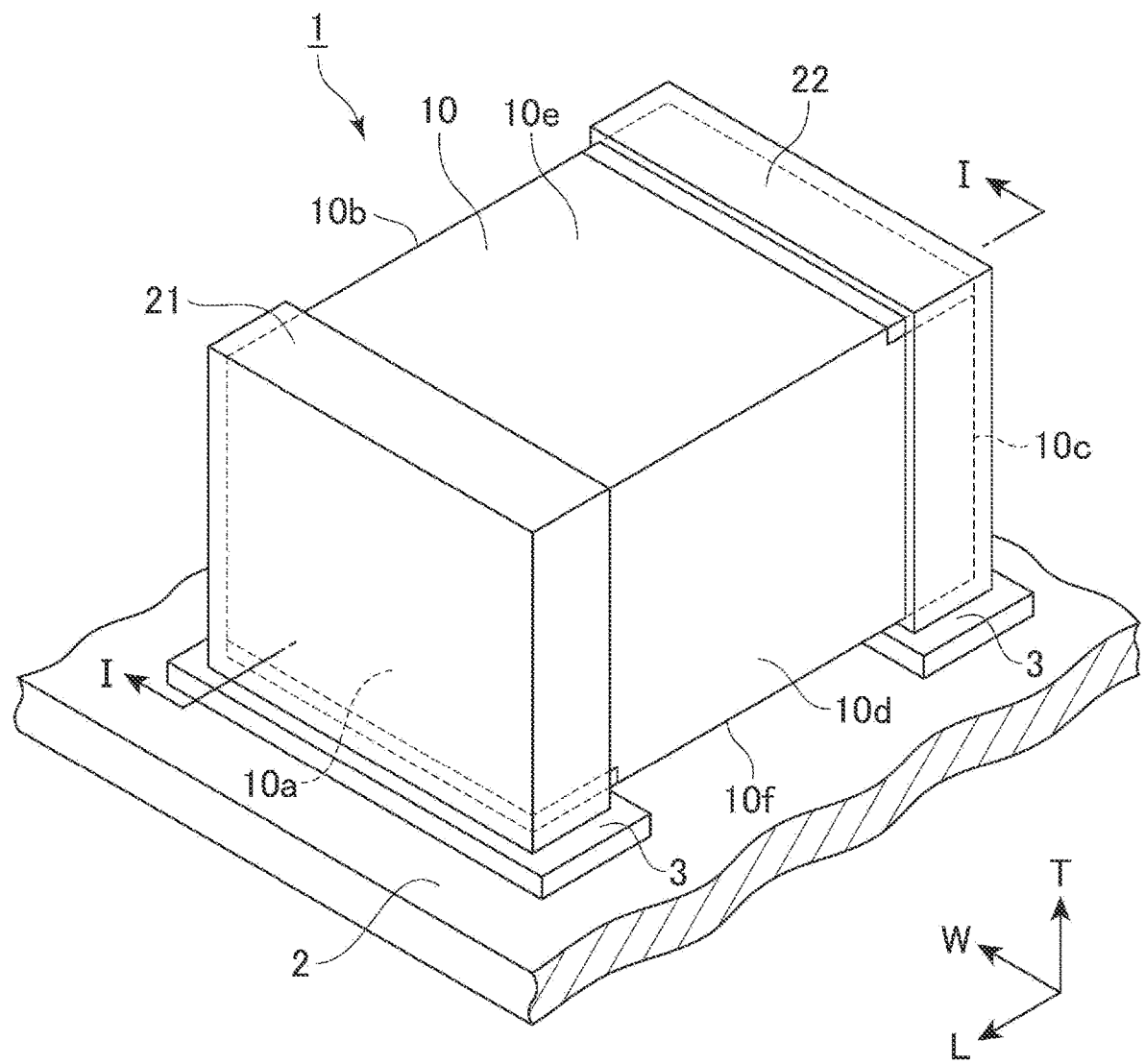
FIG. 1 is a perspective view of a coil component according to one embodiment of the present invention.
Figure 2:
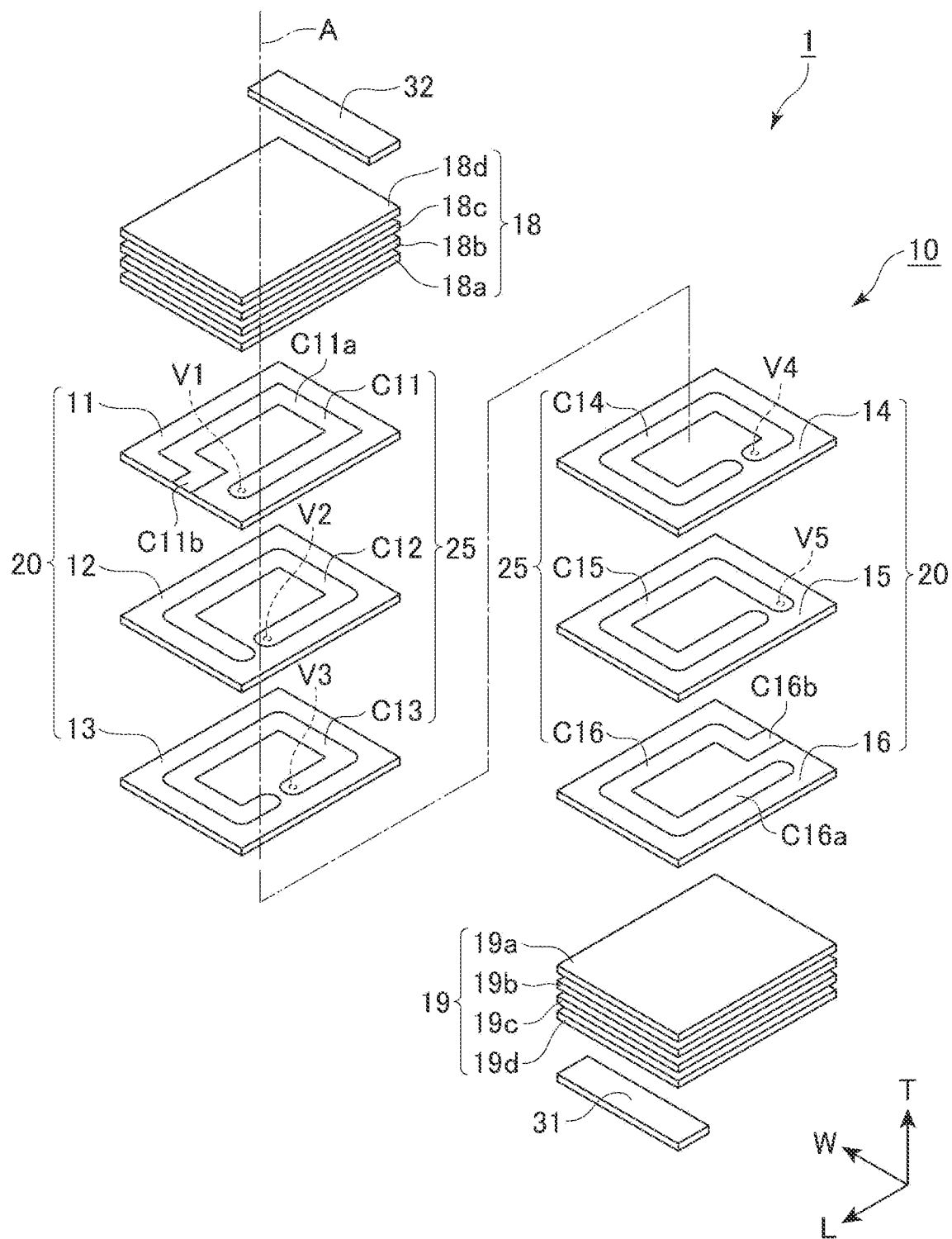
FIG. 2 is an exploded perspective view of the coil component shown in FIG. 1.

FIG. 1 is a perspective view of a coil component 1 according to one embodiment of the present invention, and FIG. 2 is an exploded perspective view of the coil component 1 shown in FIG. 1. By way of one example of the coil component 1, FIGS. 1 and 2 show a laminated inductor used as a passive element in various circuits. A laminated inductor is one example of a coil component to which the present invention is applicable. The present invention is applicable to a power inductor incorporated in a power source line and various other coil components.

The coil component 1 in the embodiment shown includes a magnetic base body 10 containing soft magnetic metal particles, a coil conductor 25 embedded in the magnetic base body 10, an external electrode 21 electrically connected to one end of the coil conductor 25, and an external electrode 22 electrically connected to the other end of the coil conductor 25. The coil component 1 further includes an insulator 31 and an insulator 32. The insulator 31 insulates between the external electrode 21 and the coil conductor 25, and the insulator 32 insulates between the external electrode 22 and the coil conductor 25. In the embodiment shown, the coil component 1 includes the insulator 31 and the insulator 32, but any one of insulators 31, 32 can be omitted. In other words, it is possible that the coil component 1 includes the insulator 31 and does not include the insulator 32, and it is also possible that the coil component 1 includes the insulator 32 and does not include the insulator 31.

The coil component 1 is mounted on a circuit board 2. The circuit board 2 may have land portions 3 provided thereon. The coil component 1 may be mounted on the circuit board 2 by joining the external electrodes 21,22 to the corresponding land portions 3 of the circuit board 2. The circuit board 2 can be installed in various electronic devices. Examples of an electronic device including the circuit board 2 on which the coil component 1 is mounted include a smartphone, a mobile phone, a tablet terminal, a game console, and any other electronic devices that can include the circuit board on which the coil component 1 is mounted.

As shown, in one embodiment of the present invention, the magnetic base body 10 is formed in a substantially rectangular parallelepiped shape. The magnetic base body 10 has a first principal surface 10e, a second principal surface 10f, a first end surface 10a, a second end surface 10c, a first side surface 10b, and a second side surface 10d. The outer surfaces of the magnetic base body 10 are defined by these six surfaces. The first principal surface 10e and the second principal surface 10f are opposed to each other, the first end surface 10a and the second end surface 10c are opposed to each other, and the first side surface 10b and the second side surface 10d are opposed to each other. The first end surface 10a and the second end surface 10c are connected to each other via the first principal surface 10e, the second principal surface 10f, the first side surface 10b, and the second side surface 10d. In a case where the magnetic base body 10 is formed in a rectangular parallelepiped shape, the first principal surface 10e and the second principal surface 10f are parallel to each other, the first end surface 10a and the second end surface 10c are parallel to each other, and the first side surface 10b and the second side surface 10d are parallel to each other. In the embodiment shown, the first end surface 10a corresponds to the "first surface" recited in the claims, the second end surface 10c corresponds to the "second surface" recited in the claims, the second principal surface 10f corresponds to the "third surface" recited in the claims, and the first principal surface 10e corresponds to the "fourth surface" recited in the claims.

In the embodiment of FIG. 1, the first principal surface 10e lies on a top side of the magnetic base body 10, and therefore, it may be herein referred to as "the top surface." Similarly, the second principal surface 10f may be referred to as "the bottom surface." The coil component 1 is disposed such that the second principal surface 10f is opposed to the circuit board (not shown), and therefore, the second principal surface 10f may be herein referred to as "the mounting surface." The top-bottom direction of the coil component 1 is based on the top-bottom direction in FIG. 1.

In this specification, a "length" direction, a "width" direction, and a "thickness" direction of the coil component 1 are referred to as an "L axis" direction, a "W axis" direction, and a "T axis" direction in FIG. 1, respectively, unless otherwise construed from the context. The L axis, the W axis, and the T axis are perpendicular to one another. The coil axis A extends in the T axis direction. The direction in which the plane containing the W axis direction and the L axis direction extends is the plane direction.

In one embodiment of the present invention, the coil component 1 has a length (the dimension in the L axis direction) of 0.2 to 6.0 mm, a width (the dimension in the W axis direction) of 0.1 to 4.5 mm, and a thickness (the dimension in the T axis direction) of 0.1 to 4.0 mm. These dimensions are mere examples, and the coil component 1 to which the present invention is applicable can have any dimensions that conform to the purport of the present invention. In one embodiment, the coil component 1 has a low profile. For example, the coil component 1 has a width larger than the thickness thereof.

Coil patterns C11 to C16 extend along the planar direction perpendicular to the coil axis A and are separated from each other in the direction of the coil axis A. The coil patterns C11 to C16 are each electrically connected to an adjacent one of these coil patterns via the vias V1 to V5 (described later), and the coil patterns C11 to C16 connected together in this manner constitute a coil conductor 25. The coil pattern C11 is opposed to the first principal surface 10e, and the coil pattern C16 is opposed to the second principal surface 10f.

FIG. 2 is an exploded perspective view of the coil component 1 shown in FIG. 1. In FIG. 2, the external electrode 21 and the external electrode 22 are omitted for convenience of illustration. As shown, the magnetic base body 10 includes a body portion 20, a top cover layer 18 provided on the top-side surface of the body portion 20, and a bottom cover layer 19 provided on the bottom-side surface of the body portion 20. The body portion 20 includes magnetic layers 11 to 16 stacked together. The coil component 1 shown includes the top cover layer 18, the magnetic layer 11, the magnetic layer 12, the magnetic layer 13, the magnetic layer 14, the magnetic layer 15, the magnetic layer 16, and the bottom cover layer 19 that are stacked in this order from the top to the bottom in FIG. 2. FIG. 2 does not show a cavity in the top cover layer 18 produced by pressing in the insulator 31 and a cavity in the bottom cover layer 19 produced by pressing in the insulator 32. These cavities will be described later.

The top cover layer 18 includes four magnetic layers 18a to 18d. The top cover layer 18 includes the magnetic layer 18a, the magnetic layer 18b, the magnetic layer 18c, and the magnetic layer 18d that are stacked in this order from the bottom to the top in FIG. 2.

The bottom cover layer 19 includes four magnetic layers 19a to 19d. The bottom cover layer 19 includes the magnetic layer 19a, the magnetic layer 19b, the magnetic layer 19c, and the magnetic layer 19d that are stacked in this order from the top to the bottom in FIG. 2.

The magnetic layers 11 to 16 have the coil patterns C11 to C16 formed thereon, respectively. The coil patterns C11 to C16 each extend around the coil axis A. The coil pattern C11 includes a circumferential portion C11a and a lead-out conductor C11b. The circumferential portion C11a extends around the coil axis A, and the lead-out conductor C11b extends from one end of the circumferential portion C11a to the external electrode 21. The coil pattern C11 is connected to the external electrode 21 at the lead-out conductor C11b. Similarly to the coil pattern C11, the coil pattern C16 includes a circumferential portion C16a and a lead-out conductor C16b. The circumferential portion C16a extends around the coil axis A, and the lead-out conductor C16b extends from one end of the circumferential portion C16a to the external electrode 22. The coil pattern C16 is connected to the external electrode 22 at the lead-out conductor C16b. In the embodiment shown, the coil axis A extends in the T axis direction, which is the same as the lamination direction of the magnetic layers 11 to 16. The coil axis A intersects the first principal surface 10e and the second principal surface 10f.

In another embodiment of the present invention, the magnetic layers 11 to 16 may be stacked together in the W axis direction. In this case, since the coil patterns C11 to C16 are formed on the surfaces of the magnetic layers 11 to 16, respectively, the coil axis A is oriented in the W axis direction, which is the same as the lamination direction of the magnetic layers 11 to 16.

In one embodiment, the magnetic layers 11 to 16, the magnetic layers 18a to 18d, and the magnetic layers 19a to 19d are formed by binding together a multitude of soft magnetic metal particles each having an insulating film formed on the surface thereof. The insulating film is, for example, an oxide film formed by oxidizing a surface of a soft magnetic metal. Soft magnetic metal particles applicable to the present invention include particles of, for example, an Fe—Si—Cr, Fe—Si—Al, or Fe—Ni alloy, an Fe—Si—Cr—B—C or Fe—Si—B—Cr amorphous alloy, Fe, or a mixture of these materials.

The coil component 1 can include any number of magnetic layers as necessary in addition to the magnetic layers 11 to 16, the magnetic layers 18a to 18d, and the magnetic layers 19a to 19d. Some of the magnetic layers 11 to 16, the magnetic layers 18a to 18d, and the magnetic layers 19a to 19d can be omitted as appropriate.

The magnetic layers 11 to 15 are provided with vias V1 to V5, respectively, at predetermined locations therein. The vias V1 to V5 are formed by forming a through-hole at the predetermined location in the magnetic layers 11 to 15 so as to extend through the magnetic layers 11 to 15 in the T axis direction and filling the through-holes with a conductive material.

The coil patterns C11 to C16 and the vias V1 to V5 are formed of a metal having an excellent electrical conductivity, such as Ag, Pd, Cu, or Al, or any alloy of these metals.

The specific materials mentioned herein are examples, and other suitable materials not mentioned herein can also be used as materials of the constituent elements of the coil component 1.

Figure 3:
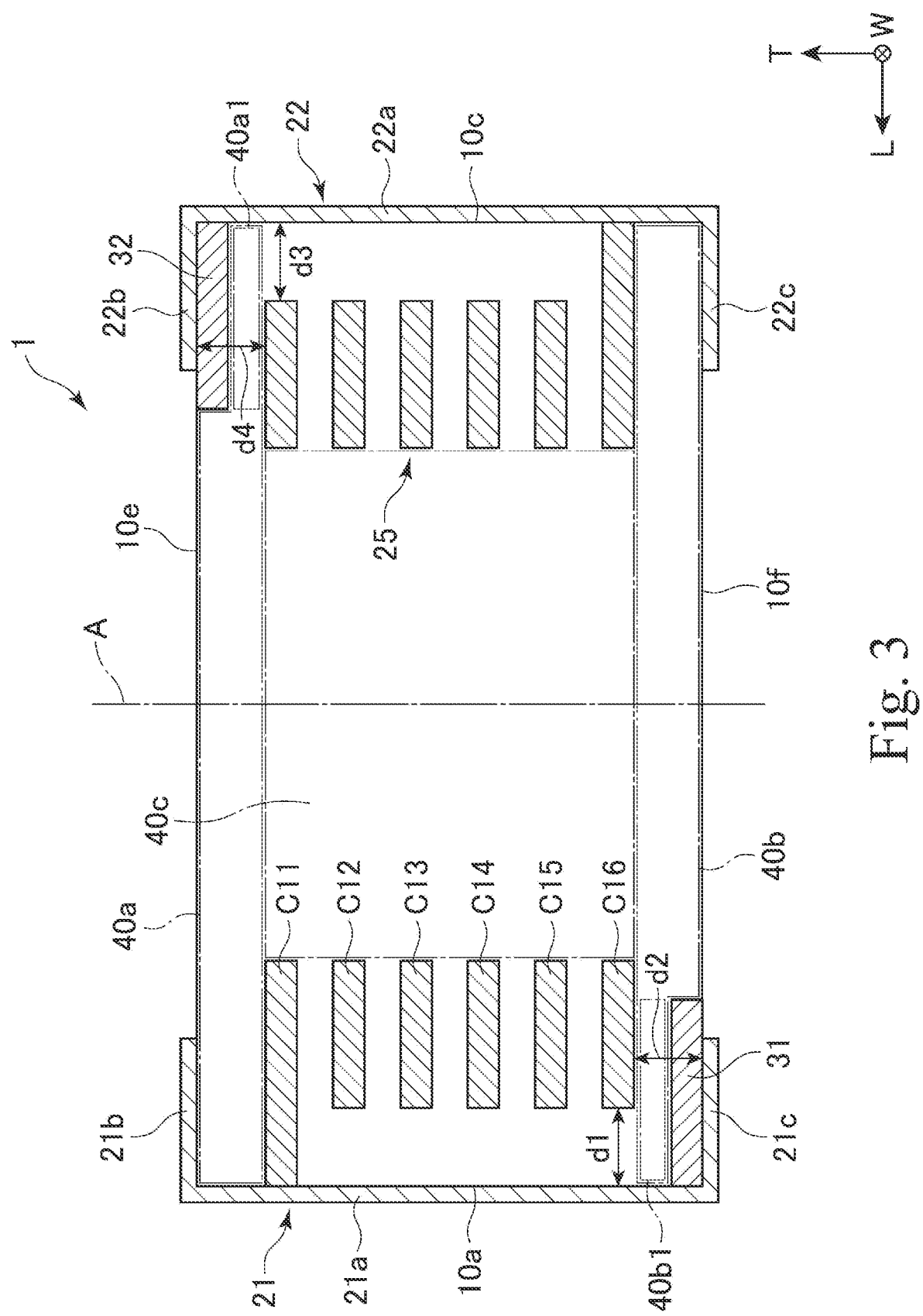
FIG. 3 schematically shows a longitudinal section of the coil component along the line I-I in FIG. 1.
Figure 4:
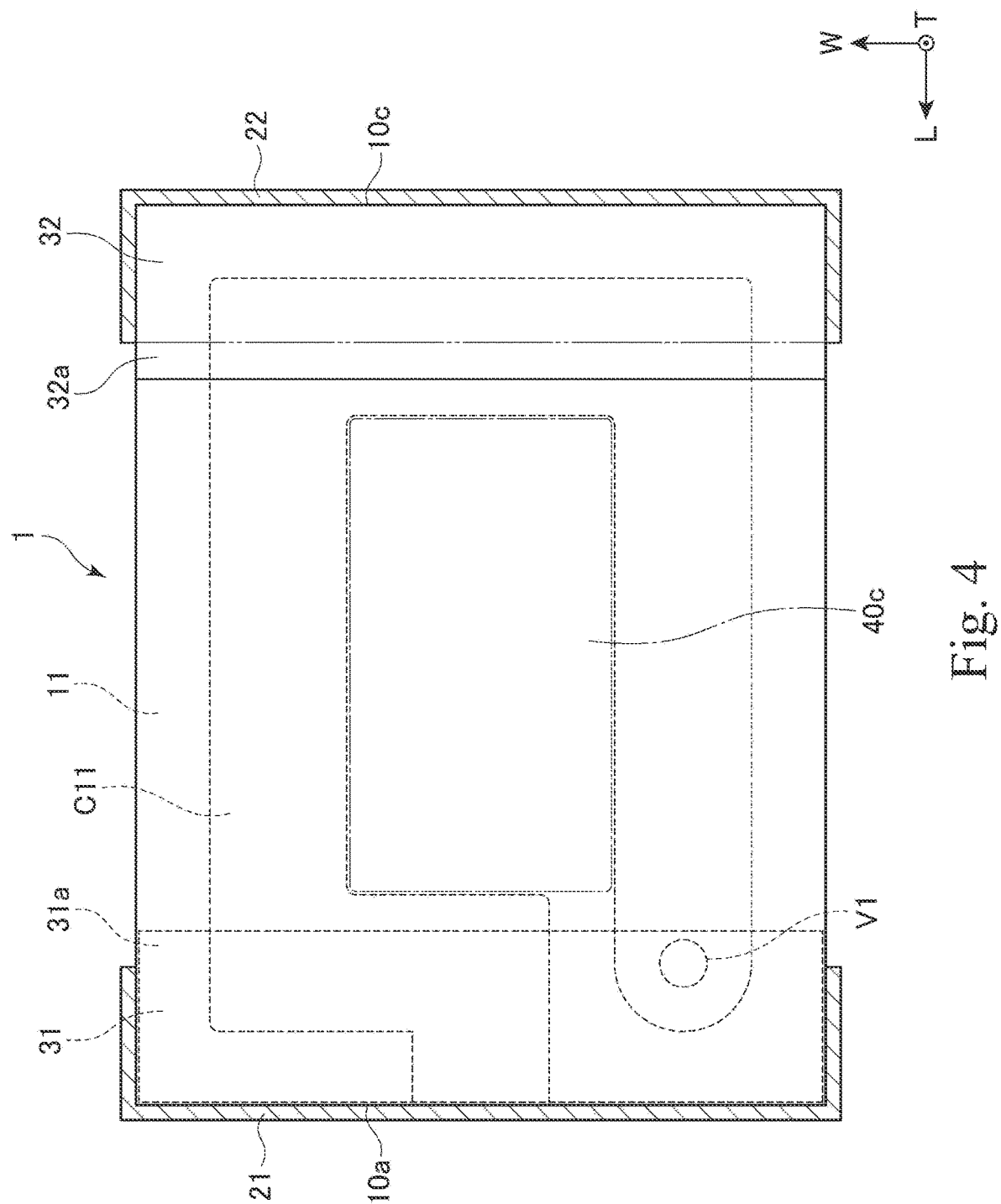
FIG. 4 is a schematic plan view of the coil component shown in FIG. 1. A part of a second external electrode 22 is not shown in FIG. 4.

Next, with reference to FIGS. 3 and 4, a further description is given of the coil component 1. FIG. 3 schematically shows a longitudinal section of the coil component 1 along the line I-I in FIG. 1, and FIG. 4 is a schematic plan view of the coil component 1. A part of the second external electrode 22 (a flange portion 22b which will be described later) is not shown in FIG. 4. In the embodiment shown, the external electrode 21 and the external electrode 22 are provided on the surface of the magnetic base body 10. The external electrode 21 is spaced from the external electrode 22 in the L axis direction for electrical insulation from the external electrode 22.

A detailed description is now given of the external electrode 21 and the external electrode 22. In the embodiment shown, the external electrode 21 includes a main electrode portion 21a provided on the first end surface 10a, a flange portion 21b provided on the first principal surface 10e, and a flange portion 21c provided on the second principal surface 10f. The main electrode portion 21a is a plate-shaped member extending along the first end surface 10a. The main electrode portion 21a covers either the whole or a part of the first end surface 10a. The flange portion 21b is a plate-shaped member connected to the top end of the main electrode portion 21a and extending along the first principal surface 10e. The flange portion 21c is a plate-shaped member connected to the bottom end of the main electrode portion 21a and extending along the second principal surface 10f.

In the embodiment shown, the external electrode 22 includes a main electrode portion 22a provided on the second end surface 10c, a flange portion 22b provided on the first principal surface 10e, and a flange portion 22c provided on the second principal surface 10f. The main electrode portion 22a is a plate-shaped member extending along the second end surface 10c. The main electrode portion 22a covers either the whole or a part of the second end surface 10c. The flange portion 22b is a plate-shaped member connected to the top end of the main electrode portion 22a and extending along the first principal surface 10e. The flange portion 22c is a plate-shaped member connected to the bottom end of the main electrode portion 22a and extending along the second principal surface 10f.

As shown in FIG. 3, the distance d2 between the coil pattern C16 and the flange portion 21c of the external electrode 21 is smaller than the distance d1 between the coil pattern C16 and the main electrode portion 21a of the external electrode 21, and the distance d4 between the coil pattern C11 and the flange portion 22b of the external electrode 22 is smaller than the distance d3 between the coil pattern C11 and the main electrode portion 22a of the external electrode 22. In other words, the distance d2 between the coil conductor 25 and the external electrode 21 and the distance d4 between the coil conductor 25 and the external electrode 22 in the direction along the coil axis A is smaller than the distance d1 between the coil conductor 25 and the external electrode 21 and the distance d3 between the coil conductor 25 and the external electrode 22 in the direction perpendicular to the coil axis A. The distance d1 may be equal to the distance d3, and the distance d2 may be equal to the distance d4.

The distance d1 is determined based on the volume resistivity of the magnetic base body 10 and the voltage applied to the coil conductor 25 such that no dielectric breakdown occurs between the coil pattern C16 and the main electrode portion 21a of the external electrode 21. The potential difference between the main electrode portion 21a of the external electrode 21 and the coil conductor 25 is largest between the main electrode portion 21a and the coil pattern C16 among the coil patterns constituting the coil conductor 25. This is because the coil pattern C16 is connected at the lead-out conductor C16b directly to the external electrode 22, which has the largest potential difference from the external electrode 21. Therefore, since the distance d1 is determined such that no dielectric breakdown occurs between the coil pattern C16 and the main electrode portion 21a, the dielectric breakdown is also prevented between the main electrode portion 21a and the coil patterns C11 to C15, which are the other coil patterns constituting the coil conductor 25. The insulator 31 having an excellent insulation quality is provided between the coil pattern C16 and the flange portion 21c, and therefore, the dielectric breakdown is also prevented between the coil pattern C16 and the flange portion 21c. Since the volume resistivity of the insulator 31 is larger than that of the magnetic base body 10, the distance d2 is determined so as to be smaller than the distance d1. The distance d3 is determined based on the volume resistivity of the magnetic base body 10 and the voltage applied to the coil conductor 25 such that no dielectric breakdown occurs between the coil pattern C11 and the main electrode portion 22a of the external electrode 22. Since the volume resistivity of the insulator 32 is larger than that of the magnetic base body 10, the distance d4 is determined so as to be smaller than the distance d3. As described above, any one of the insulator 31 and the insulator 32 can be omitted. When the insulator 31 is omitted, the distance d2 may be equal to or larger than the distance d1. In this case, the distance d2 is determined such that no dielectric breakdown occurs between the coil pattern C16 and the main electrode portion 21a in the absence of the insulator 31. When the insulator 32 is omitted, the distance d4 may be equal to or larger than the distance d3. In this case, the distance d4 is determined such that no dielectric breakdown occurs between the coil pattern C11 and the main electrode portion 22a in the absence of the insulator 32.

The shapes of the external electrodes 21, 22 applicable to the present invention are not limited to the illustrated examples. For example, the external electrode 21 may not have the flange portion 21b, and the external electrode 22 may not have the flange portion 22c.

As shown in FIG. 3, the magnetic base body 10 includes a plurality of regions. More specifically, the magnetic base body 10 includes a top cover region 40a, a bottom cover region 40b, and a core region 40c. The top cover region 40a is disposed between the coil pattern C11 of the coil conductor 25 and the first principal surface 10e. The bottom cover region 40b is disposed between the coil pattern C16 of the coil conductor 25 and the second principal surface 10f. The core region 40c is disposed inside the coil conductor 25. The top cover region 40a includes the top cover layer 18. The bottom cover region 40b includes the bottom cover layer 19. The bottom cover region 40b may also include the magnetic layer 16. The core region 40c corresponds to the regions of the magnetic layers 11 to 16 inside the coil conductor 25 in the planar direction perpendicular to the coil axis A. The core region 40c may not include the magnetic layer 16.

The top cover region 40a includes an overlap region 40a1 overlapping with the insulator 32 as viewed from the direction along the coil axis A, and the bottom cover region 40b includes an overlap region 40b1 overlapping with the insulator 31 as viewed from the direction along the coil axis A. As described above, the magnetic base body 10 contains soft magnetic metal particles. In one embodiment, the density of the soft magnetic metal particles in the magnetic base body 10 is higher in the overlap region 40a1 of the top cover region 40a and the overlap region 40b1 of the bottom cover region 40b than in the remaining regions (the region in the top cover region 40a other than the overlap region 40a1, and the region in the bottom cover region 40b other than the overlap region 40b1). As will be described later, in the production process of the coil component 1, the insulator 31 and the insulator 32 are pressed in in the T axis direction. As a result, the overlap region 40a1 is subjected to a higher molding pressure than the remaining region of the top cover region 40a, and the overlap region 40b1 is subjected to a higher molding pressure than the remaining region of the bottom cover region 40b. Therefore, the density of the soft magnetic metal particles is higher in the overlap region 40a1 than in the remaining region of the top cover region 40a. Also, the density of the soft magnetic metal particles is higher in the overlap region 40b1 than in the remaining region of the bottom cover region 40b.

Next, a further description is given of the insulator 31 and the insulator 32. As shown in FIG. 3, the insulator 31 is disposed between the flange portion 21c of the external electrode 21 and the coil pattern C16. The insulator 31 covers a part of the second principal surface 10f of the magnetic base body 10. That is, the insulator 31 covers not the whole but a part of the second principal surface 10f. The insulator 31 is preferably flush or substantially flush with the second principal surface 10f of the magnetic base body 10.

The insulator 32 is disposed between the flange portion 22b of the external electrode 22 and the coil pattern C11. The insulator 32 covers a part of the first principal surface 10e of the magnetic base body 10. That is, the insulator 32 covers not the whole but a part of the first principal surface 10e. The insulator 32 may be flush or substantially flush with the first principal surface 10e of the magnetic base body 10.

As shown in FIG. 4, the insulator 31 is positioned so as not to overlap with the core region 40c as viewed from the direction along the coil axis A. Likewise, the insulator 32 is positioned so as not to overlap with the core region 40c as viewed from the direction along the coil axis A.

The insulator 31 and the insulator 32 have a higher insulation quality than the magnetic base body 10. The insulator 31 and the insulator 32 are formed of, for example, glass, a glass composite material made of glass mixed with a filler, a metal magnetic material including Fe having an oxide film formed by thermal oxidation, or a mixture of these materials. The insulator 31 and the insulator 32 may be formed of different materials. The volume resistivity of the materials forming the insulator 31 and the insulator 32 is, for example, equal to or greater than $1 \times 10^6 \Omega \cdot cm$, $1 \times 10^7 \Omega \cdot cm$, $1 \times 10^8 \Omega \cdot cm$, or $1 \times 10^9 \Omega \cdot cm$. More preferably, the volume resistivity of the materials forming the insulator 31 and the insulator 32 is higher than the volume resistivity of the material forming the magnetic base body 10 by $10^2 \Omega \cdot cm$. Therefore, the insulator 31 and the insulator 32 having a small thickness can insulate between the external electrode 21 and the coil conductor 25 and between the external electrode 22 and the coil conductor 25. The materials of the insulator 31 and the insulator 32 explicitly described herein are examples. The insulator 31 and the insulator 32 may be formed of materials not explicitly described herein.

In one embodiment, the insulator 31 is optically distinguishable from the second principal surface 10f or the bottom cover region 40b of the magnetic base body 10. The insulator 32 is optically distinguishable from the first principal surface 10e or the top cover region 40a of the magnetic base body 10. The insulator 31 and the insulator 32 may contain a coloring matter for optical distinction. The coloring matter contained in the insulator 31 and the insulator 32 may be, for example, metal oxides such as oxides of chrome, cobalt, iron, copper, and titanium or mixtures thereof. The insulator 31 and the insulator 32 may be colorless if they are optically distinguishable from the magnetic base body 10.

As disclosed in Japanese Patent Application Publication No. 2018-37516, a marker may be provided on the surface of the coil component to indicate the orientation and attitude of the electronic component. The marker provided on the coil component is used to verify the orientation and attitude of the coil component. For example, in mounting the coil component on a circuit board, the marker provided on the surface of the coil component may be identified by an image recognition technique, so as to ensure that the coil component is mounted on the circuit board in an appropriate orientation and attitude.

As shown in FIG. 4, in the bottom view, a part of the insulator 31 projects out of the flange portion 21c of the external electrode 21 in the negative direction of the L axis. In other words, in the bottom view, the insulator 31 includes an exposure portion 31a that is exposed from the flange portion 21c. Likewise, in the plan view, a part of the insulator 32 projects out of the flange portion 22b of the external electrode 22 in the positive direction of the L axis. In other words, in the top view, the insulator 32 includes an exposure portion 32a that is exposed from the flange portion 22b. Since the exposure portion 31a of the insulator 31 and the exposure portion 32a of the insulator 32 are exposed at the surface of the coil component 1, the insulator 31 and the insulator 32 can be used as markers.

In the embodiment shown, the insulator 31 is disposed close to the first end surface 10a in the L axis direction, while the lead-out conductor C16b of the coil pattern C16 is exposed to the external electrode 22 at the second end surface 10c that is opposite to the first end surface 10a in the L axis direction. As described above, the coil conductor 25 is connected to the external electrode 22 at the lead-out conductor C16b. Therefore, the position of the insulator 31 indicates the position at which the coil conductor 25 is connected to the external electrode 22. More specifically, the position of the insulator 31, which is close to the first end surface 10a, indicates that the coil conductor 25 is connected to the external electrode 22 at the second end surface 10c that is opposite to the first end surface 10a in the L axis direction. The insulator 32 is disposed close to the second end surface 10c in the L axis direction, while the lead-out conductor C11b of the coil pattern C11 is exposed to the external electrode 21 at the first end surface 10a that is opposite to the second end surface 10c in the L axis direction. As described above, the coil conductor 25 is connected to the external electrode 21 at the lead-out conductor C11b. Therefore, the position of the insulator 32 generally indicates the position at which the coil conductor 25 is connected to the external electrode 21. More specifically, the position of the insulator 32, which is close to the second end surface 10c, indicates that the coil conductor 25 is connected to the external electrode 21 at the first end surface 10a that is opposite to the second end surface 10c in the L axis direction.

Figure 5:
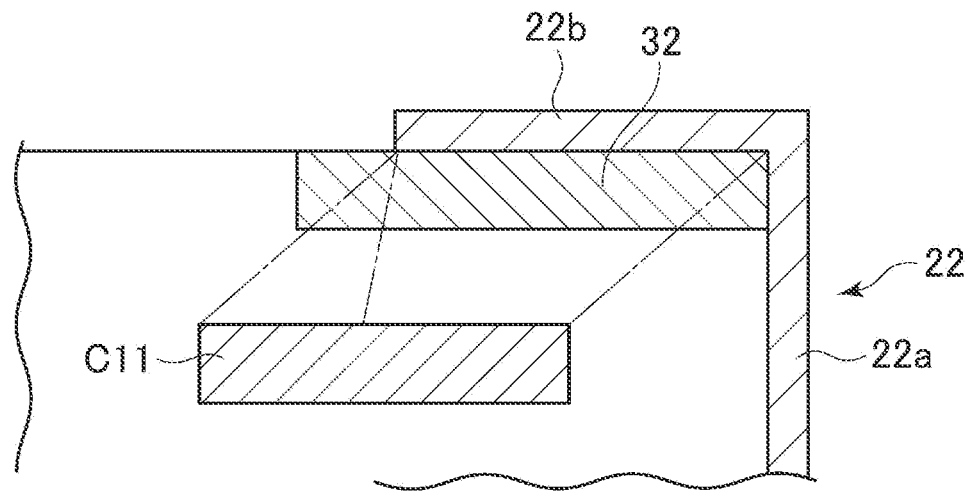
FIG. 5 shows an arrangement of an insulator in the coil component of FIG. 1.
Figure 6:
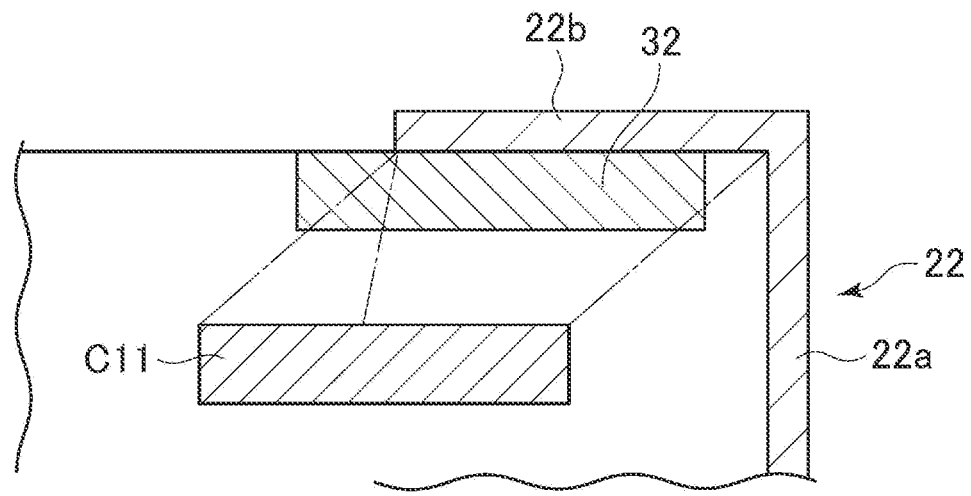
FIG. 6 shows an arrangement of the insulator in another embodiment of the present invention.

A further description is given of the arrangement of the insulator 31 and the insulator 32 with reference to FIGS. 5 and 6. FIG. 5 shows an enlarged view of the top right corner of the sectional view of FIG. 3. As shown in FIG. 5, the insulator 32 is positioned on a line segment connecting between any portion of the flange portion 22b of the external electrode 22 and any portion of the coil pattern C11. In other words, the line segment connecting between any portion of the flange portion 22b of the external electrode 22 and any portion of the coil pattern C11 passes through the insulator 32. Since the insulator 32 having an excellent insulation quality is disposed between any portion of the flange portion 22b and any portion of the coil pattern C11, the insulator 32 prevents dielectric breakdown between the flange portion 22b and the coil pattern C11. Although not shown, in one embodiment, the insulator 31 is positioned on a line segment connecting between any portion of the flange portion 21c of the external electrode 21 and any portion of the coil pattern C16. The arrangement of the insulator 31 and the flange portion 21c of the external electrode 21 is similar to that of the insulator 32 and the flange portion 22b of the external electrode 22 described above. Since the insulator 31 having an excellent insulation quality is disposed between any portion of the flange portion 21c and any portion of the coil pattern C16, the insulator 31 prevents dielectric breakdown between the flange portion 21c and the coil pattern C16. In one embodiment, the insulator 32 is positioned on a line segment having a length smaller than d3 among the line segments connecting between any portion of the flange portion 22b of the external electrode 22 and any portion of the coil pattern C11. As to the line segments having a length equal to or larger than d3 among the line segments connecting between any portion of the flange portion 22b of the external electrode 22 and any portion of the coil pattern C11, no dielectric breakdown occurs in the sections corresponding to the line segments between the flange portion 22b and the coil pattern C11 having a length equal to or larger than d3, and therefore, it is not necessary that the insulator 32 is disposed in such sections. Likewise, in one embodiment, the insulator 31 is positioned on a line segment having a length smaller than d1 among the line segments connecting between any portion of the flange portion 21c of the external electrode 21 and any portion of the coil pattern C16.

FIG. 6 shows a variation of the insulator 32. While the insulator 32 shown in FIG. 5 contacts with the external electrode 22, the insulator 32 shown in FIG. 6 is slightly spaced from the external electrode 22. The insulator 32 shown in FIG. 6 is also positioned on a line segment connecting between any portion of the flange portion 22b of the external electrode 22 and any portion of the coil pattern C11, and therefore, the insulator 32 can prevent dielectric breakdown between the coil pattern C11 and the flange portion 22b. Likewise, the insulator 31 may be spaced from the external electrode 21.

Next, a description is given of an example of a production method of the coil component 1. The first step is to form a top laminate and a bottom laminate. The top laminate will be the top cover layer 18, and the bottom laminate will be the bottom cover layer 19. The top laminate is formed by stacking together a plurality of magnetic sheets that are to be the magnetic layers 18a to 18d. Likewise, the bottom laminate is formed by stacking together a plurality of magnetic sheets that are to be the magnetic layers 19a to 19d. These magnetic sheets are formed by applying a slurry to a surface of a plastic base film, drying the slurry, and cutting the dried slurry to a predetermined size. The slurry is formed of, for example, a resin material containing soft magnetic metal particles mixed with a solvent. The resin material having the soft magnetic metal particles dispersed therein may be, for example, a polyvinyl butyral (PVB) resin, an epoxy resin, or any other resin materials having an excellent insulation quality.

The next step is to form an intermediate laminate to be the body portion 20. The intermediate laminate is formed by stacking together composite sheets each formed of one of the magnetic sheets to be the magnetic layers 11 to 16 and the corresponding one of unfired conductor patterns to be the coil patterns C11 to C16. These composite sheets are prepared as follows. First, the magnetic sheets are prepared in the same manner as described above. Next, a through-hole is formed in the magnetic sheets at the location corresponding to the vias V1 to V5. Subsequently, a conductive paste is printed by, for example, screen printing on each of the magnetic sheets to form an unfired conductor pattern on the magnetic sheet. At this time, the through-hole formed in each magnetic sheet is filled with the conductive paste. This process produces the unfired conductor pattern to be the coil patterns C11 to C16 and the vias V1 to V5. The conductor patterns and the vias can be formed by any various known methods instead of the screen printing.

Next, an insulator pattern to be the insulator 31 is provided on the bottom surface of the magnetic sheet at the bottom layer of the magnetic base body 10 (for example, the magnetic sheet to be the magnetic layer 19d), and an insulator pattern to be the insulator 32 is provided on the top surface of the magnetic sheet at the top layer of the magnetic base body 10 (for example, the magnetic sheet to be the magnetic layer 18d). The insulator patterns contain an insulating material such as glass. The insulator patterns are formed on the corresponding magnetic sheets by printing, transfer, or other known techniques.

Next, the bottom laminate, the intermediate laminate, and the top laminate are stacked together in the stated order in the direction of the T axis from the negative side to the positive side, and these stacked laminates are bonded together by thermal compression using a pressing machine to produce a body laminate. In producing the body laminate, the insulator pattern to be the insulator 31 and the insulator pattern to be the insulator 32 are subjected to a pressure in the lamination direction. With this pressure, the insulator pattern to be the insulator 31 is embedded into the bottom surface of the magnetic sheet at the bottom layer of the magnetic base body 10, and the insulator pattern to be the insulator 32 is embedded into the top surface of the magnetic sheet at the top layer of the magnetic base body 10.

Next, the body laminate is diced to a desired size using a cutter such as a dicing machine or a laser processing machine to produce a chip laminate. Next, the chip laminate is degreased and then heated. The end portions of the chip laminate are polished by barrel-polishing or the like, if necessary.

Next, a conductive paste is applied to both end portions of the chip laminate to form the external electrodes 21 and 22. At least one of a solder barrier layer and a solder wetting layer may be formed on the external electrode 21 and the external electrode 22 as necessary. The coil component 1 is obtained, as described above.

A part of the steps included in the above production method may be omitted as necessary. In the production method of the coil component 1, steps not described explicitly in this specification may be performed as necessary. A part of the steps included in the production method of the coil component 1 may be performed in different order within the purport of the present invention. A part of the steps included in the production method of the coil component 1 may be performed at the same time or in parallel, if possible.

Advantageous effects of the above embodiments will be now described. First, a description is given of general approaches to improve inductance in a coil component having a coil conductor wound around a coil axis and embedded in a magnetic base body. There are two known approaches to improve inductance in such a coil component. The first approach is to enlarge the area of the core region of the coil conductor, and the second approach is to increase the number of turns of the coil conductor. To improve inductance by the first approach without increasing the device size of the coil component, it is necessary to reduce the distance between the coil conductor and an external electrode (specifically, a portion of the external electrode disposed on the surface of the magnetic base body not intersecting the coil axis) in the direction perpendicular to the coil axis. With a reduced distance between the coil conductor and the external electrode in the direction perpendicular to the coil axis, the coil conductor can have a larger inner diameter without increase of the device size. As a result, the area of the core region can be made larger. To improve inductance by the second approach without increasing the device size of the coil component, it is necessary to reduce the distance between the coil conductor and an external electrode (specifically, a portion of the external electrode disposed on the surface of the magnetic base body intersecting the coil axis) in the direction along the coil axis. With a reduced distance between the coil conductor and the external electrode in the direction along the coil axis, the coil conductor can have a larger dimension in the direction along the coil axis (a coil length) without increase of the device size. As a result, the number of turns of the coil conductor can be increased.

Conventional coil components are designed such that the distance between the coil conductor and the external electrode is equal to or larger than an insulation distance for preventing dielectric breakdown between the coil conductor and the external electrode. The insulation distance is calculated based on the volume resistivity of the magnetic base body having the coil component embedded therein and the working voltage of the coil component. Supposing that the volume resistivity of the magnetic base body is uniform, the insulation distance required to ensure insulation is the same in both the direction perpendicular to the coil axis and the direction along the coil axis. Therefore, in conventional coil components, the same insulation distance is ordinarily prescribed for both the direction perpendicular to the coil axis and the direction along the coil axis.

By contrast, in the above embodiment, the distances d2 and d4 between the coil conductor 25 and the external electrodes 21, 22 in the direction along the coil axis A are smaller than the distances d1 and d3 between the coil conductor 25 and the external electrodes 21, 22 in the direction perpendicular to the coil axis A. The inductance of the coil component is proportional to the area of the core region of the coil conductor and is also proportional to the square of the number of turns of the coil conductor. Therefore, as in the above embodiment, the distances between the coil conductor 25 and the external electrodes 21, 22 in the direction along the coil axis A are smaller than the distances between the coil conductor 25 and the external electrodes 21, 22 in the direction perpendicular to the coil axis A, so as to improve the inductance by the increased number of turns of the coil conductor. As described above, in the above embodiment, the distances d2, d4 between the coil conductor 25 and the external electrodes 21, 22 in the direction along the coil axis A are smaller than the distances d1, d3 between the coil conductor 25 and the external electrodes 21, 22 in the direction perpendicular to the coil axis A, so as to efficiently improve the inductance of the coil component 1.

When the distances d2, d4 between the coil conductor 25 and the external electrodes 21, 22 in the direction along the coil axis A are smaller than the distances d1, d3 between the coil conductor 25 and the external electrodes 21, 22 in the direction perpendicular to the coil axis A, dielectric breakdown tends to occur between the external electrode 21 and the coil pattern C16 having a potential close to that of the external electrode 22 and between the external electrode 22 and the coil pattern C11 having a potential close to that of the external electrode 21. To address this point, in the coil component 1 of the above embodiment, the insulator 31 is provided between the flange portion 21c of the external electrode 21 and the coil pattern C16 in the coil conductor 25 opposed to the flange portion 21c. This ensures the insulation between the external electrode 21 and the coil conductor 25 in the direction along the coil axis A. In one embodiment, the insulator 31 is positioned on a line segment connecting between any portion of the flange portion 21c of the external electrode 21 and any portion of the coil pattern C16. Therefore, it is possible to ensure insulation between the external electrode 21 and the coil conductor 25 in the direction along the coil axis A. On the opposite end in the direction of the coil axis A, the insulator 32 is provided between the coil pattern C11 and the flange portion 21b of the external electrode 22. This ensures the insulation between the external electrode 22 and the coil conductor 25 in the direction along the coil axis A.

Assuming that the distances d1, d3 between the coil conductor 25 and the external electrodes 21, 22 in the direction perpendicular to the coil axis A should be as small as the distances d2, d4, it is necessary to dispose insulators between the coil conductor 25 and the external electrodes 21, 22 in the direction perpendicular to the coil axis A to ensure insulation therebetween. On the other hand, electrical connection is required between one end of the coil conductor 25 and the external electrode 21 and between the other end of the coil conductor 25 and the external electrode 22. Therefore, the insulators for insulation between the coil conductor 25 and the external electrodes 21, 22 in the direction perpendicular to the coil axis A have to be positioned so as not to inhibit the electrical connection between both ends of the coil conductor 25 and the external electrodes 21, 22. Therefore, an extremely high working accuracy is required in positioning the insulators for insulation between the coil conductor 25 and the external electrodes 21, 22 in the direction perpendicular to the coil axis A. Therefore, it is not desirable to dispose the insulators between the coil conductor 25 and the external electrodes 21, 22 (more specifically, the main electrode portions 21a, 22a) in the direction perpendicular to the coil axis A. By contrast, the insulator 31 is disposed between the coil conductor 25 and the flange portion 21c of the external electrode 21 which does not mechanically contact with the coil conductor 25, and therefore, a high working accuracy is not required in positioning the insulator 31. Likewise, a high working accuracy is not required for the insulator 32. Therefore, as in the above embodiment, it is advantageous that the insulators 31, 32 readily ensure insulation between the coil conductor 25 and the external electrodes 21, 22.

The insulators 31, 32 are formed of an insulating material having a lower magnetic permeability than the magnetic base body 10, and therefore, the insulators 31, 32 may possibly reduce the inductance. In the above embodiment, the insulator 31 covers not the whole but a part of the second principal surface 10f intersecting the coil axis A of the magnetic base body 10, and therefore, it can be prevented that the inductance is reduced by addition of the element formed of an insulating material. Likewise, in the above embodiment, the insulator 32 covers not the whole but a part of the first principal surface 10e intersecting the coil axis A of the magnetic base body 10, and therefore, it can be prevented that the inductance is reduced by addition of the element formed of an insulating material.

In the embodiment described above, the insulator 31 is positioned so as not to overlap with the core region 40c as viewed from the direction along the coil axis A. This arrangement makes it possible to prevent that the inductance is reduced by the insulator 31. Likewise, the insulator 32 is positioned so as not to overlap with the core region 40c as viewed from the direction along the coil axis A, making it possible to prevent that the inductance is reduced by the insulator 32.

In the above embodiment, the overlap region 40a1 can contain the soft magnetic metal particles at a high density. Likewise, the overlap region 40b1 can contain the soft magnetic metal particles at a high density. The magnetic flux generated by the electric current flowing through the coil conductor 25 concentrates in the overlap regions 40a1, 40b1. Therefore, the high density of the soft magnetic metal particles in the overlap region 40a1 and/or the overlap region 40b1 increases the inductance of the coil component 1.

In the embodiment described above, the insulator 31 is optically distinguishable from the bottom cover region 40b. Therefore, the insulator 31 can be used as a marker. In other words, the insulator 31 indicates the orientation and attitude of the coil component. The insulator 32 can also be used as a marker.

The coil component 1 described above makes it possible to improve inductance of a circuit without increasing its size. Further, an electronic device having such a circuit installed thereon can provide an excellent performance. When a high inductance is not required, the coil component 1 can be downsized. Further, a circuit board and an electronic device having such a downsized coil component 1 installed thereon can also be downsized.

The dimensions, materials, and arrangements of the constituent elements described herein are not limited to those explicitly described for the embodiments, and these constituent elements can be modified to have any dimensions, materials, and arrangements within the scope of the present invention. Furthermore, constituent elements not explicitly described herein can also be added to the described embodiments, and it is also possible to omit some of the constituent elements described for the embodiments.

What is claimed is:

1. A coil component comprising:
   a magnetic base body having a first surface, a second surface opposed to the first surface, a third surface connecting between the first surface and the second surface, and a fourth surface opposed to the third surface;
   a first external electrode provided on the first surface of the magnetic base body,
   a second external electrode including a main electrode portion and a flange portion, the main electrode portion being provided on the second surface of the magnetic base body, the flange portion being provided on the fourth surface of the magnetic base body;
   a coil conductor including a first coil pattern and a second coil pattern, the first coil pattern including a first lead-out conductor connected to the second external electrode, the second coil pattern being opposed to the fourth surface and including a second lead-out conductor connected to the first external electrode; and
   a first insulator provided between the flange portion of the second external electrode and the second coil pattern,
   wherein the first insulator is positioned remote from the second coil pattern.

2. The coil component of claim 1, wherein the first insulator is positioned on a line segment connecting between any portion of the flange portion of the second external electrode and any portion of the second coil pattern.

3. The coil component of claim 1,
   wherein the magnetic base body includes a core region disposed inside the coil conductor, and
   wherein the first insulator is positioned so as not to overlap the core region as viewed from a direction along a coil axis, the coil axis intersecting the third surface and the fourth surface.

4. The coil component of claim 1,
   wherein the magnetic base body includes a cover region disposed between the second conductor pattern and the fourth surface,
   wherein the magnetic base body contains soft magnetic metal particles, and
   wherein a density of the soft magnetic metal particles contained in the cover region is higher in a region overlapping the first insulator as viewed from a direction along a coil axis than in a remaining region, the coil axis intersecting the third surface and the fourth surface.

5. The coil component of claim 4, wherein the first insulator is optically distinguishable from the cover region.

6. The coil component of claim 5, wherein the first insulator includes a marker portion positioned so as not to overlap with the flange portion of the second electrode as viewed from a direction along a coil axis, the coil axis intersecting the third surface and the fourth surface.

7. The coil component of claim 1,
   wherein the coil component further comprises a second insulator provided between the first external electrode and the first coil pattern, wherein the magnetic base body includes a core region disposed inside the coil conductor; and wherein the second insulator is positioned so as not to overlap with the core region as viewed from the direction along a coil axis, the coil axis intersecting the third surface and the fourth surface.

8. The coil component of claim 7,
   wherein the magnetic base body includes a cover region disposed between the second conductor pattern and the fourth surface and another cover region disposed between the first conductor pattern and the third surface,
   wherein the magnetic base body contains soft magnetic metal particles, and
   wherein a density of the soft magnetic metal particles contained in the other cover region is higher in a region overlapping the second insulator as viewed from the direction along a coil axis than in a remaining region, the coil axis intersecting the third surface and the fourth surface.

9. The coil component of claim 8, wherein the second insulator is optically distinguishable from the other cover region.

10. A circuit board comprising the coil component of claim 1.

11. An electronic device comprising the circuit board of claim 10.

* * * * *